United States Patent
Komatsuzaki

(10) Patent No.: US 11,545,334 B2
(45) Date of Patent: Jan. 3, 2023

(54) CHARGED PARTICLE BEAM DEVICE

(71) Applicant: Hitachi High-Tech Corporation, Tokyo (JP)

(72) Inventor: Ryo Komatsuzaki, Tokyo (JP)

(73) Assignee: Hitachi High-Tech Corporation, Tokyo (JP)

(*) Notice: Subject to any disclaimer, the term of this patent is extended or adjusted under 35 U.S.C. 154(b) by 70 days.

(21) Appl. No.: 17/262,422

(22) PCT Filed: Aug. 2, 2018

(86) PCT No.: PCT/JP2018/029127
§ 371 (c)(1),
(2) Date: Jan. 22, 2021

(87) PCT Pub. No.: WO2020/026422
PCT Pub. Date: Feb. 6, 2020

(65) Prior Publication Data
US 2021/0296085 A1    Sep. 23, 2021

(51) Int. Cl.
*H01J 37/20* (2006.01)
*H01J 37/22* (2006.01)
(Continued)

(52) U.S. Cl.
CPC .......... *H01J 37/20* (2013.01); *H01J 37/222* (2013.01); *H01J 37/244* (2013.01); *H01J 37/302* (2013.01)

(58) Field of Classification Search
CPC ........ H01J 37/20; H01J 37/222; H01J 37/244; H01J 37/302; H01J 37/265; H01J 2237/20285; H01J 37/22
See application file for complete search history.

(56) References Cited

U.S. PATENT DOCUMENTS 3,472,997 A * 10/1969 Fair ............... H01J 37/3005
219/121.29
4,179,604 A * 12/1979 Christou ............ G01T 1/20
250/305

(Continued)

FOREIGN PATENT DOCUMENTS

JP    2008-251407 A    10/2008
JP    2009-525571 A    7/2009

(Continued)

OTHER PUBLICATIONS

International Search Report (PCT/ISA/210) issued in PCT Application No. PCT/JP2018/029127 dated Oct. 30, 2018 with English translation (five (5) pages).

(Continued)

*Primary Examiner* — David A Vanore
(74) *Attorney, Agent, or Firm* — Crowell & Moring LLP

(57) ABSTRACT

The invention provides a charged particle beam device that can accurately move a convergence point of a charged particle beam to a surface of a sample and facilitates a user to grasp a positional relation between the surface of the sample and the convergence point of the charged particle beam. The charged particle beam device according to the invention includes: an electron optics system configured to irradiate a sample table with a charged particle beam; a movable stage on which the sample table is to be placed; a sample chamber that accommodates the movable stage; a detector configured to detect a signal from a sample placed on the sample table; a camera configured to capture an image of the sample table and the sample; an extraction means configured to extract outer shape information relating to outer shapes of the sample table and the sample from the image captured by the camera; a control unit configured to control the movable stage based on the outer shape information; and a display unit configured to display an image (Continued)

relating to the outer shape information together with the image captured by the camera.

14 Claims, 11 Drawing Sheets

(51) Int. Cl.
*H01J 37/244* (2006.01)
*H01J 37/302* (2006.01)

(56) References Cited

U.S. PATENT DOCUMENTS

| | | | | |
|---|---|---|---|---|
| 4,900,932 A * | 2/1990 | Schafer | ................ | H01J 37/244 |
| | | | | 250/397 |
| 4,962,306 A * | 10/1990 | Hodgson | ................ | H01J 37/244 |
| | | | | 250/311 |
| 5,408,098 A * | 4/1995 | Wells | ................ | H01J 37/244 |
| | | | | 250/305 |
| 7,964,846 B2 * | 6/2011 | Mooney | ................ | H01J 37/244 |
| | | | | 250/311 |
| 8,648,301 B2 * | 2/2014 | Bean | ................ | H01J 37/228 |
| | | | | 250/311 |
| 10,049,855 B2 * | 8/2018 | Guerra | ................ | H01J 37/21 |
| 10,241,062 B2 * | 3/2019 | Ominami | ................ | H01J 37/28 |
| 10,777,379 B1 * | 9/2020 | Hosoya | ................ | H01J 37/244 |
| 11,183,377 B2 * | 11/2021 | Bevis | ................ | G01T 1/2006 |
| 2005/0045832 A1 * | 3/2005 | Kelly | ................ | H01J 49/488 |
| | | | | 250/397 |
| 2005/0173644 A1 * | 8/2005 | Gnauck | ................ | H01J 37/244 |
| | | | | 250/370.11 |
| 2008/0185509 A1 * | 8/2008 | Knowles | ................ | H01J 37/256 |
| | | | | 250/251 |
| 2008/0315120 A1 | 12/2008 | Albiez | | |
| 2011/0155930 A1 | 6/2011 | Kawaguchi et al. | | |
| 2011/0291010 A1 * | 12/2011 | Katane | ................ | H01J 37/244 |
| | | | | 250/310 |
| 2013/0075606 A1 | 3/2013 | Uemoto et al. | | |
| 2013/0234032 A1 * | 9/2013 | Wang | ................ | G01T 1/20 |
| | | | | 250/368 |
| 2014/0374594 A1 * | 12/2014 | Kaneko | ................ | G01T 1/2008 |
| | | | | 250/311 |
| 2015/0090889 A1 * | 4/2015 | Kuroda | ................ | G01T 1/2006 |
| | | | | 250/362 |

FOREIGN PATENT DOCUMENTS

| | | |
|---|---|---|
| JP | 2010-198998 A | 9/2010 |
| JP | 2010-225825 A | 10/2010 |
| JP | 2011-134974 A | 7/2011 |
| JP | 2012-138219 A | 7/2012 |
| JP | 2013-65511 A | 4/2013 |
| JP | 2014-93283 A | 5/2014 |
| WO | WO 2016/088260 A1 | 6/2016 |

OTHER PUBLICATIONS

Japanese-language Written Opinion (PCT/ISA/237) issued in PCT Application No. PCT/JP2018/029127 dated Oct. 30, 2018 (four (4) pages).

* cited by examiner

| Stage | | | | | | Detector | | | Image |
|---|---|---|---|---|---|---|---|---|---|
| X | Y | Z | T | R | A | B | C | |
| 0.0 | 0.0 | 1.0 | 0.0 | 0.0 | PRESENT | ABSENT | ABSENT | ./i001.bmp |
| 0.0 | 0.0 | 2.0 | 0.0 | 0.0 | PRESENT | ABSENT | ABSENT | ./i002.bmp |
| ... | ... | ... | ... | ... | ... | ... | ... | ... |
| 0.0 | 0.0 | 1.0 | 0.0 | 0.0 | PRESENT | PRESENT | ABSENT | ./i101.bmp |
| 0.0 | 0.0 | 2.0 | 0.0 | 0.0 | PRESENT | PRESENT | ABSENT | ./i102.bmp |
| ... | ... | ... | ... | ... | ... | ... | ... | ... |

301

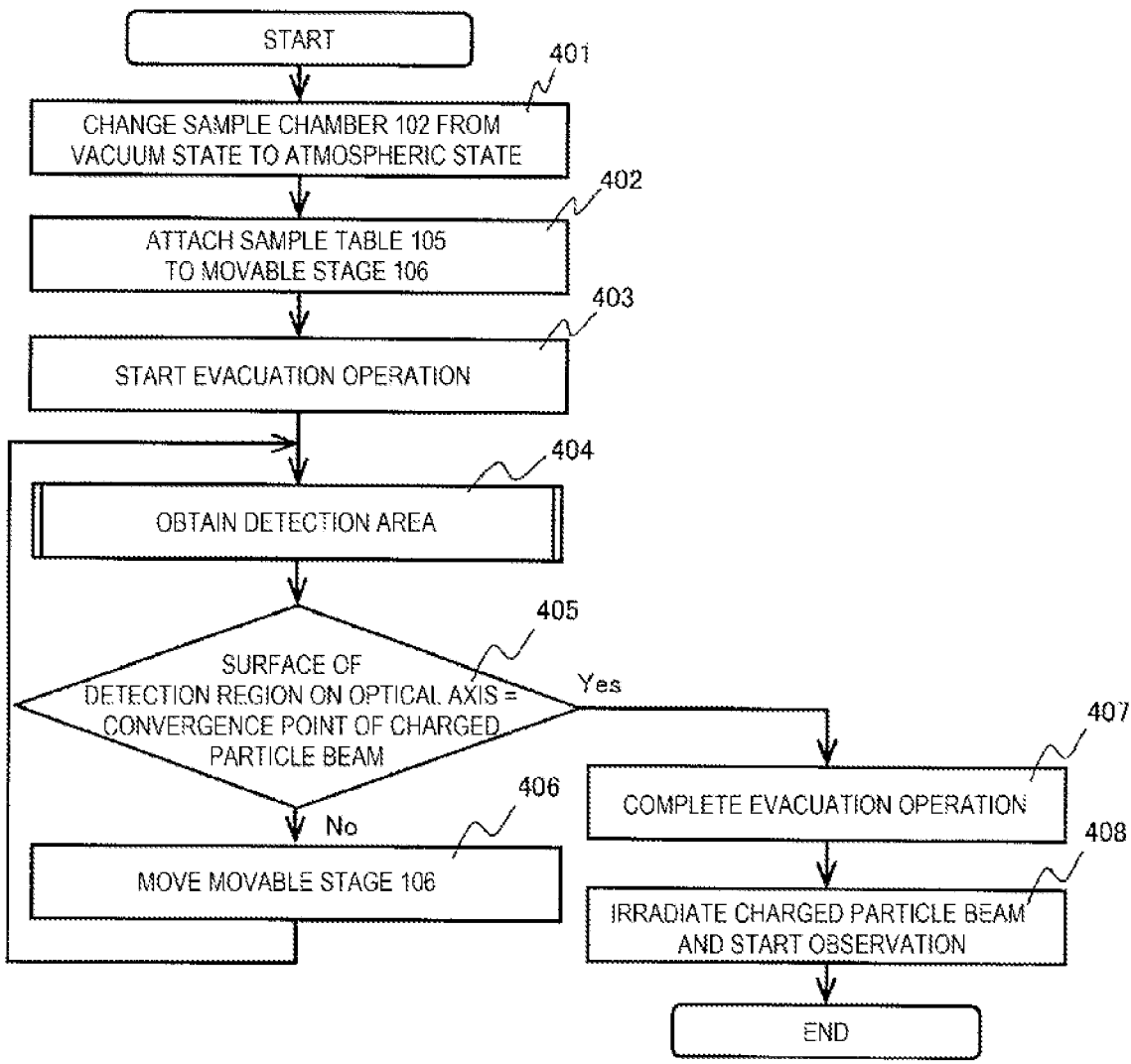

[FIG. 5A]
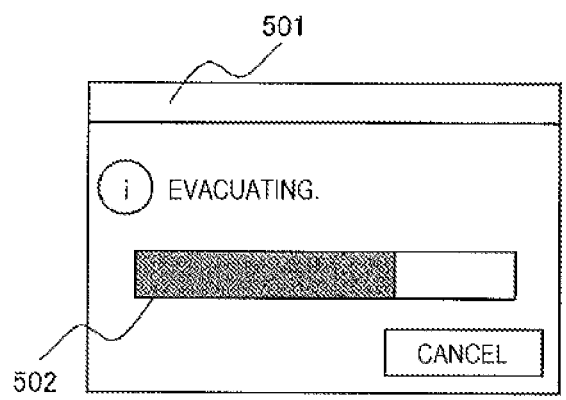
[FIG. 5B]
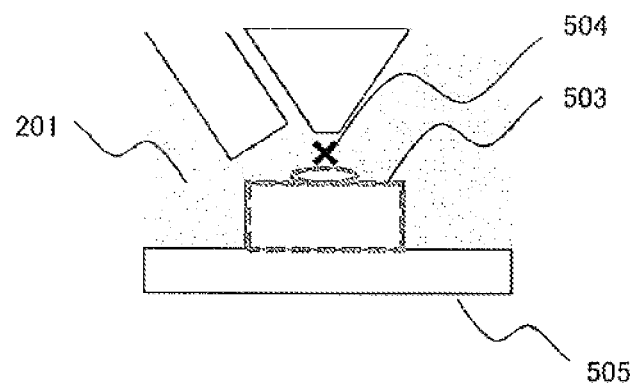

[FIG. 6A]
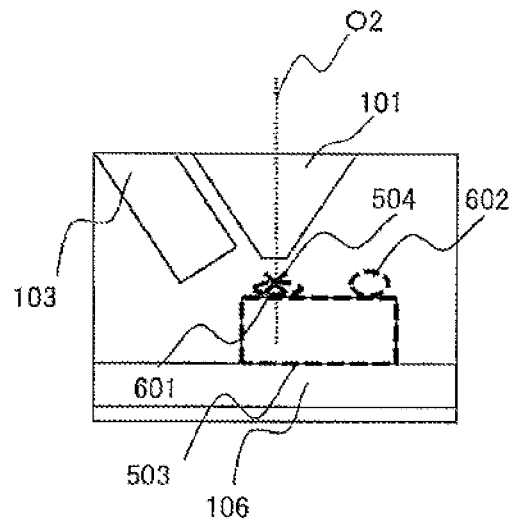
[FIG. 6B]
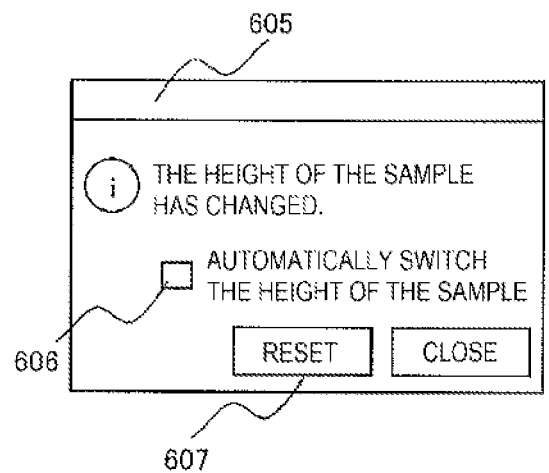

[FIG. 6C]
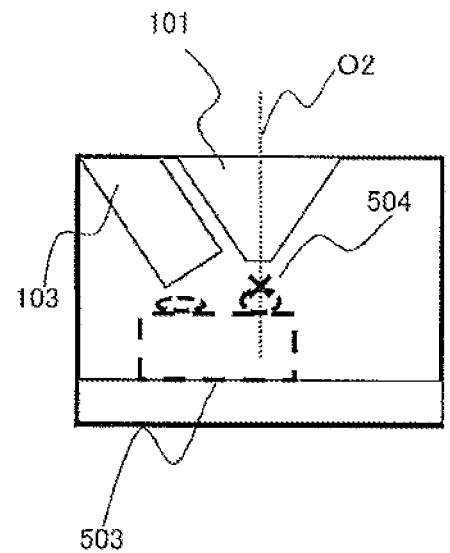
[FIG. 7A]
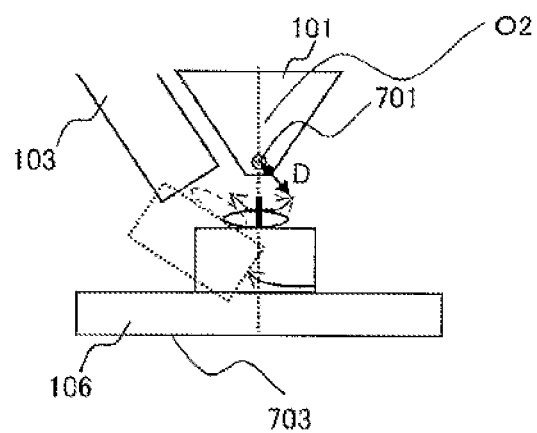

[FIG. 7B]
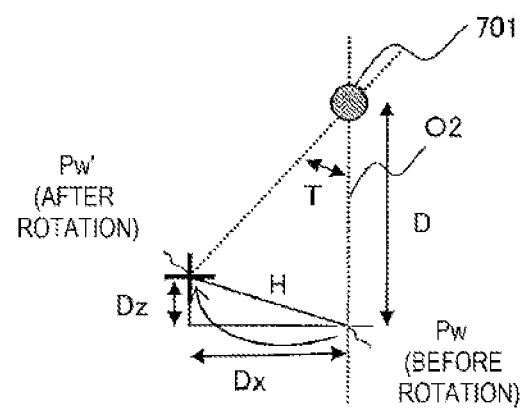
[FIG. 7C]
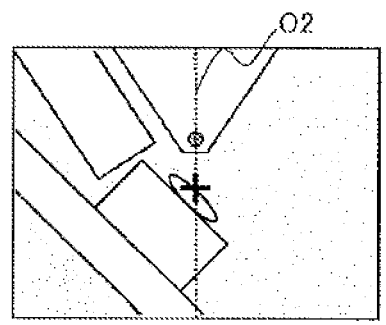

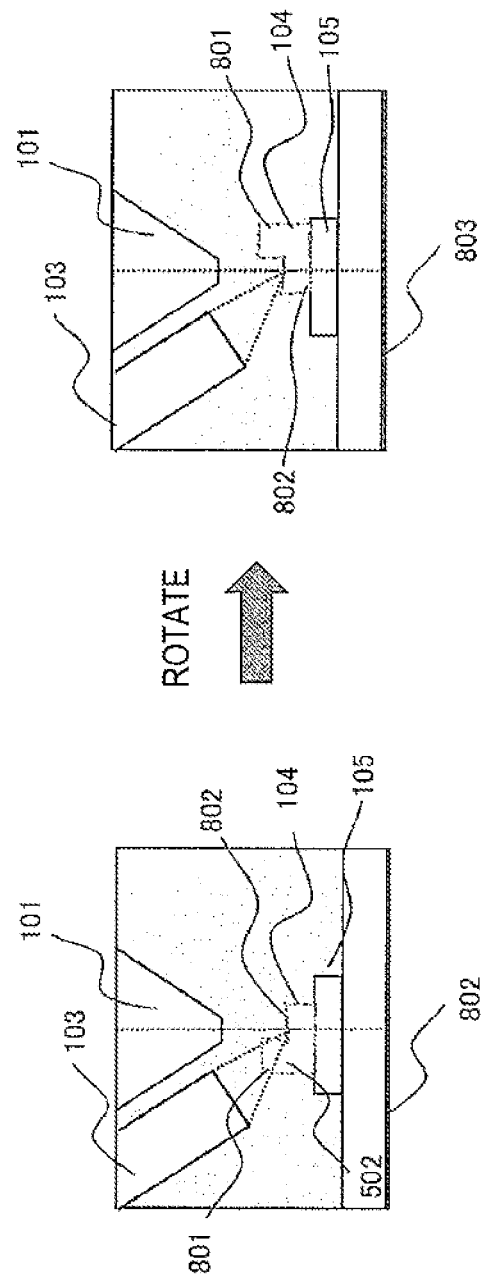
[FIG. 8]

[FIG. 9]
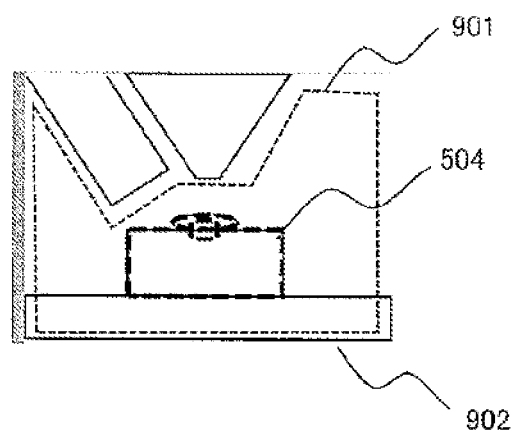
[FIG. 10A]
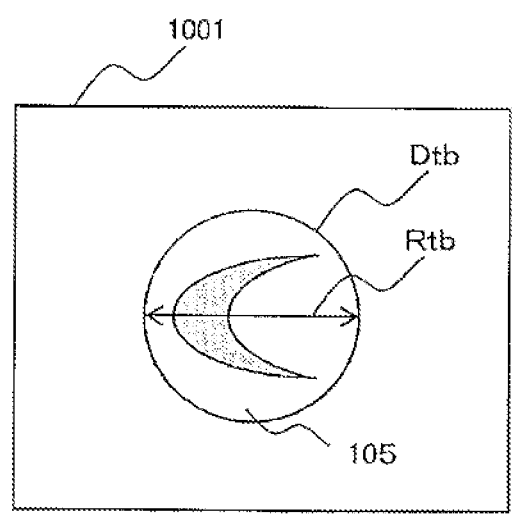

[FIG. 10B]
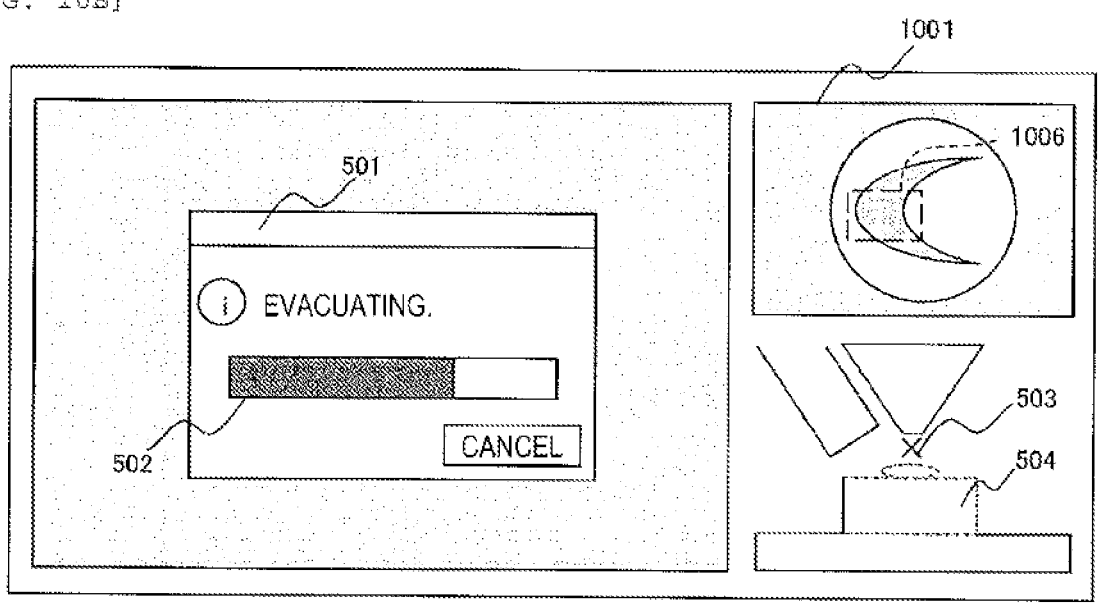

CHARGED PARTICLE BEAM DEVICE

TECHNICAL FIELD

The present invention relates to a charged particle beam device.

BACKGROUND ART

In a charged particle beam device, it is necessary to dispose a sample table in a vacuum sample chamber in order to prevent scattering of a charged particle beam used for observation. A charged particle beam device is known in which in order to confirm a state of an inside of a sealed sample chamber, the inside of a sample chamber is provided with an optical camera and can be observed via an external monitor.

However, when the inside of the sample chamber is imaged by the optical camera and displayed on the external monitor for confirmation by an operator, the operator needs to simultaneously observe an observation image of a sample based on irradiation of the charged particle beam (image intended to be observed) and an image of the inside of the sample chamber imaged by the optical camera and adjust a position of the sample table. For this reason, a throughput of inspection may be reduced, or the operator may accidentally damage the sample.

Therefore, a device that automatically detects a position of a sample table on which a sample is placed and automatically adjusts the position of the sample table (movable stage) is also known from, for example, Patent Literature 1. In the device of Patent Literature 1, the position of the sample table can be automatically detected by making a reflectance of the sample chamber and a reflectance of the sample table to be detected different from each other. However, in the technique of Patent Literature 1, it is necessary to make the reflectance of the sample table and of the sample chamber different from each other, which has a problem of lacking versatility. In addition, devices that automatically detect a sample table are also known from Patent Literature 2, Patent Literature 3, etc., but in each case, there are restrictions on a relative positional relation between the camera and the sample table, properties of the sample, etc., which also has the problem of lacking versatility.

Further, although well-known devices such as Patent Literatures 1 to 3 can automatically determine and specify the position of the sample table, a position of a convergence point of the charged particle beam is set on a surface of the sample table to be detected. Therefore, there is a problem that it is not easy to control the movable stage or the like in consideration of the position of the surface of the sample. Further, since a user cannot clearly grasp the position of the surface of the sample, it is not always easy to accurately grasp a movable degree of the movable stage when looking at the image captured by the camera.

CITATION LIST

Patent Literature

PTL 1: WO 2016/088260
PTL 2: JP-A-2011-134974
PTL 3: JP-A-2010-225825

SUMMARY OF INVENTION

Technical Problem

An object of the invention is to provide a charged particle beam device that can accurately move a convergence point of a charged particle beam to a surface of a sample and facilitates a user to grasp a positional relation between the surface of the sample and the convergence point of the charged particle beam.

Solution to Problem

A charged particle beam device according to the invention includes: an electron optics system configured to irradiate a sample table with a charged particle beam; a movable stage on which the sample table is to be placed; a sample chamber that accommodates the movable stage; a detector configured to detect a signal from a sample placed on the sample table; a camera configured to capture an image of the sample table and the sample; an extraction means configured to extract outer shape information relating to outer shapes of the sample table and the sample from the image captured by the camera; a control unit configured to control the movable stage based on the outer shape information; and a display unit configured to display an image relating to the outer shape information together with the image captured by the camera.

Advantageous Effect

According to the invention, information relating to the outer shapes of the sample table and the sample is extracted from the image captured by the camera by the extraction means and is displayed on the display unit together with the image captured by the camera. Therefore, it is possible to adjust a convergence position of the charged particle beam on the surface of the sample. Further, since the outer shape information relating to the outer shape of the sample is displayed on the display unit together with the image captured by the camera, it is possible for the user to easily grasp the relation between the outer shape of the sample and the convergence position of the charged particle beam.

BRIEF DESCRIPTION OF DRAWINGS

FIG. 3 is a table illustrating an example of data stored in a database 111.

FIG. 4 is a flowchart illustrating an operation from exchange of a sample 104 to start of observation of the sample 104 after the exchange is completed in Embodiment 1.

FIG. 5A is an example of a screen displayed on a monitor 109 as a user interface during execution of an evacuation operation in Embodiment 1.

FIG. 5B is an example of a screen displayed on the monitor 109 as the user interface during the execution of the evacuation operation in Embodiment 1.

FIG. 6A is an example of a screen display (user interface) of the monitor 109 when a height (Z coordinate) of a detection region of a sample 104 varies in Embodiment 2.

FIG. 6B is an example of a screen display (user interface) of the monitor 109 when the height (Z coordinate) of the detection region of the sample 104 varies in Embodiment 2.

FIG. 6C is an example of a screen display (user interface) of the monitor 109 when the height (Z coordinate) of the detection region of the sample 104 varies in Embodiment 2.

FIG. 7A is an example of a screen display (user interface) of the monitor 109 when an inclination operation is performed on a movable stage 106 in Embodiment 3.

FIG. 7B is an example of a screen display (user interface) of the monitor 109 when the inclination operation is performed on the movable stage 106 in Embodiment 3.

FIG. 7C is an example of a screen display (user interface) of the monitor 109 when the inclination operation is performed on the movable stage 106 in Embodiment 3.

FIG. 8 is a schematic diagram illustrating an operation of Embodiment 4.

FIG. 9 is a schematic diagram illustrating an operation of Embodiment 5.

FIG. 10A is a schematic diagram illustrating Embodiment 6.

FIG. 10B is an example of the screen display (user interface) of the monitor 109 in Embodiment 6.

DESCRIPTION OF EMBODIMENTS

Next, embodiments of the invention will be described with reference to drawings.

Embodiment 1

Figure 1:
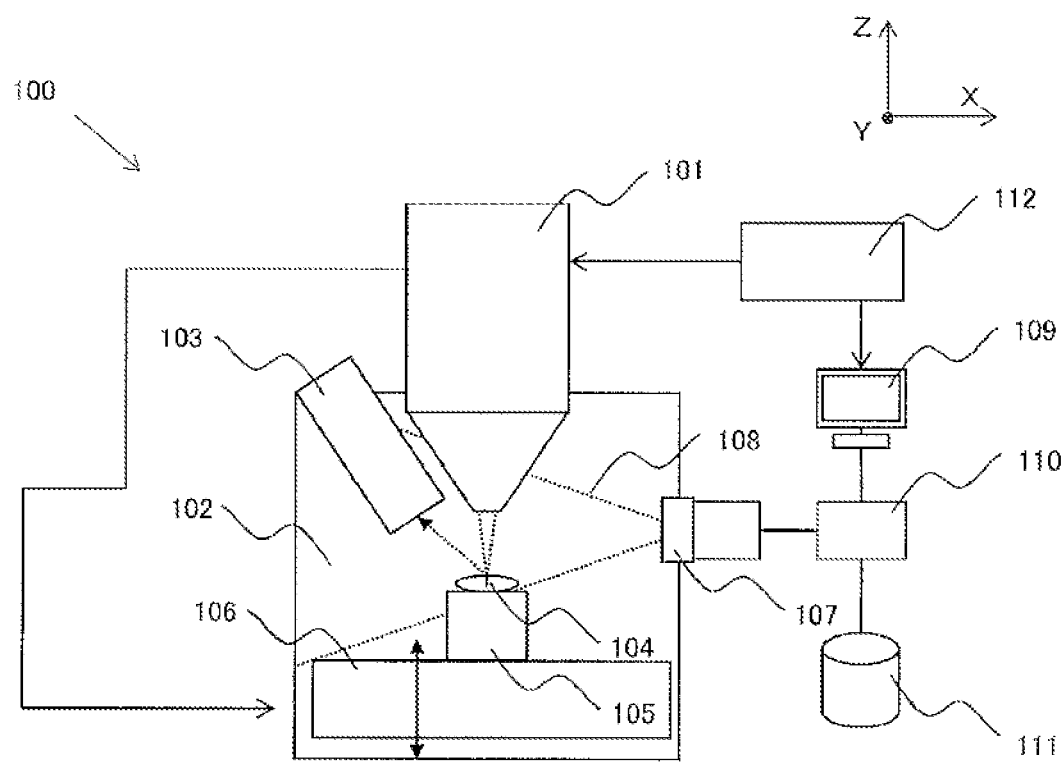
FIG. 1 is a schematic diagram showing a schematic configuration of a charged particle beam device 100 according to Embodiment 1.

A schematic configuration of a charged particle beam device 100 according to Embodiment 1 will be described with reference to FIG. 1. The charged particle beam device 100 includes an electron optics system 101 for irradiating a sample with a charged particle beam, a sample chamber 102 whose inside can be set to a vacuum state, a detector 103 for detecting signals (secondary electrons, primary electrons, X-rays, etc.) obtained from the sample, a sample table 105 for placing a sample 104 to be observed, a movable stage 106 for moving the sample table 105 to change an observation position, a camera 107 for capturing an image of the inside of the sample chamber 102, a monitor 109 for displaying an image captured by the camera 107, a processor 110 for processing the image captured by the camera 107, a database 111 for managing captured image data, and a control unit 112.

Although not shown, the electron optics system 101 includes a condenser lens, a deflector, an objective lens, etc., in addition to a charged particle source, and is configured such that the charged particle beam can be deflected and converged in a vicinity of the sample 104. As for the detector 103, only one detector is shown as an example in FIG. 1, but the charged particle beam device 100 can include a plurality of types of detectors such as a primary electron detector and an X-ray detector in addition to a secondary electron detector. The plurality of types of detectors may be insertable or detachable in the sample chamber as needed.

The sample table 105 is attachable to and detachable from the movable stage 106. Further, when a direction of an optical axis of the electron optics system 101 is a Z direction and directions parallel to a surface of the movable stage 106 are X and Y directions, the movable stage 106 is movable in the X direction, the Y direction, or the Z direction, which are orthogonal to each other. The movable stage 106 may be movable in all directions of XYZ, or may be movable in only one direction, for example, the Z direction. Further, the movable stage 106 may have an inclination angle T that can be adjusted. Further, the movable stage 106 may be rotatable by at least 180 degrees about the direction of the optical axis, and may have a rotation angle R that can be adjusted.

The camera 107 can capture an image of a state of an inside of the sample chamber 102, specifically, the electron optics system 101, the detector 103, the sample 104, and the sample table 105, which are included in an imaging field of view 108. The processor 110 executes image processing on the image captured by the camera 107 and displays image data after the image processing on the monitor 109 (display unit). Further, as will be described in detail later, according to the image data (second image) stored in the database 111, the processor 110 extracts the image of the sample 104 and the sample table 105 from a first image and highlights outer shapes or outlines of the extracted image on the monitor 109. Further, the processor 110 specifies position information of the sample 104 and the sample table 105 according to the outer shape information.

The control unit 112 controls the electron optics system 101, the movable stage 106, and the monitor 109 for observing the sample 104. Further, the control unit 112 controls a position of the movable stage 106 according to the position information of the sample 104 and the sample table 105 specified by the processor 110.

Figure 2:
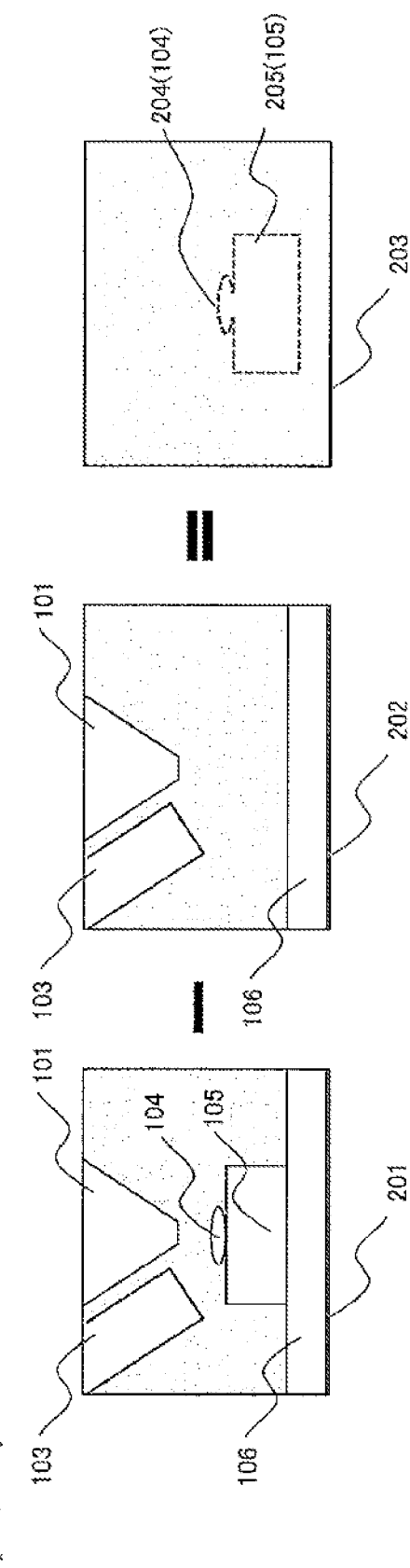
FIG. 2 is a schematic diagram illustrating details of image processing in a processor 110 of FIG. 1.

Details of image processing in the processor 110 will be described with reference to FIGS. 2 and 3. In FIG. 2, an image 201 on a left side shows an image in which the sample table 105 on which the sample 104 is placed is inserted into the sample chamber 102 of the charged particle beam device 105. The image will be referred to as a first image 201 below.

In addition, the charged particle beam device 100 stores an image of the inside of the sample chamber 102 in a state where the sample 104 and the sample table 105 are removed from the sample chamber 102 in the database 111. The image stored in the database 111 will be referred to as a second image 202 below.

By executing predetermined image processing, the processor 110 compares the first image 201 and the second image 202 and generates a third image 203 which is a difference between the first image 201 and the second image 202. The third image 203 includes an image 204 of the sample 104 and an image 205 of the sample table 105.

FIG. 3 shows an example of the image data stored in the database 111. In a table of FIG. 3, data arranged in each row in a horizontal direction indicates data relating to one image. The database 111 stores data of a plurality of second images 202. In the plurality of second images 202, a combination of position coordinates (X coordinate, Y coordinate, and Z coordinate of an orthogonal coordinate system), the inclination angle T and the rotation angle R of the movable stage 106, and whether a movable device is inserted in the sample chamber 102 (for example, the detector 103) are different from each other. The example of FIG. 3 shows the second image 202 in the case where three types of detectors (for example, a secondary electron detector A, a primary electron detector B, and an X-ray detector C) are provided as the detector 103. The second image 202 is captured and stored in the database 111 for each combination of whether the detectors A, B, and C are inserted into the sample chamber 102 (present or absent).

The processor 110 determines the position information (X, Y, Z, T, and R) of the movable stage 106 and whether the detector 103 is inserted according to control information of the movable stage 106 and the detector 103, and selects and reads the second image 202 matching a determination result from the database 111. Then, the difference between the captured first image 201 and the selected and read second image 202 is calculated to generate the third image 203 (see FIG. 2). The third image 203 includes information relating to the outer shapes of the sample 104 and the sample table 105. Therefore, the processor 110 functions as the extraction means configured to extract the information relating to the outer shapes of the sample 104 and the sample table 105.

In the above-mentioned description, the second image 202 stored in the database 111 is described as the captured image of the inside of the sample chamber 102 in the state where the sample 104 and the sample table 105 are removed from the sample chamber 102. However, this is an example for obtaining the outer shape information of the sample 104 and the sample table 105 in the third image 203, and the form of the second image 202 is not limited to the case shown in FIG. 2.

FIG. 4 is a flowchart illustrating an operation from exchange of a sample 104 to start of observation of the sample 104 after the exchange is completed. In step 401, the sample chamber 102 is switched from the vacuum state to an atmospheric state in order to newly insert the sample 104 together with the sample table 105 into the sample chamber 102. In the following step 402, the sample table 105 on which the new sample 104 is placed is attached to the movable stage 106 and placed in the sample chamber 102.

In step 403, in order to evacuate the sample chamber 102 again, an operation of discharging air to an outside (evacuation) is started. By the time the evacuation operation is completed, a procedure of adjusting the position of the movable stage 106 to a position suitable for observing the sample 104 placed on the sample table 105 is started. When the movable stage 106 is adjusted, in step 404, a region to be detected (detection region) of the sample 104 is obtained along the optical axis of the electron optical system 101. The data in the detection region of the sample 104 is obtained by executing the procedure shown in FIG. 2 based on the image data captured by the camera 107. That is, the third image 203 is generated by the difference between the first image 201 in a current state of the inside of the sample chamber 102 captured by the camera 107 and the corresponding second image 202 read from the database 111, and from the image of the sample 104 and the sample table 105 in the third image 203, the data of the detection region is specified.

In step 405, it is determined whether or not the surface of the detection region of the sample 104 on the optical axis matches the convergence point of the charged particle beam. Specifically, the coordinates of the position of the detection region extracted from the third image 203 and the coordinates of the convergence point of the charged particle beam are compared in the processor 110 to determine whether or not the difference is within a predetermined value. If they do not match, the process moves to step 406, and if they match, the process proceeds to step 407. The position information of the convergence point of the charged particle beam can be specified based on a control signal for the electron optics system 101 in the control unit 112.

In step 406, the movable stage 106 is moved to control the surface of the detection region of the sample 104 to match the convergence point of the charged particle beam. Hereinafter, the procedures of steps 404 to 406 are repeated until matching is confirmed in step 405.

When it is confirmed that the detection region of the sample 104 matches the convergence point of the charged particle beam, the evacuation operation started from step 403 is completed in step 407. Then, in step 408, irradiation of the charged particle beam is started, and observation of the sample 104 is started. As described above, according to Embodiment 1, the shapes and position information of the sample 104 and the sample table 105 are specified according to the third image 203 generated based on the first image 201 and the second image 202. Meanwhile, the convergence position of the charged particle beam is adjusted with respect to the surface of the specified sample 104. Therefore, according to Embodiment 1, the information relating to the outer shapes of the sample 104 and the sample table 105 in the processor 110 is extracted based on the first image 201 and the second image 202, and is displayed on the monitor 109 together with the image captured by the camera 107. The information relating to the outer shape is also used for adjusting the convergence position of the charged particle beam. Therefore, it is possible to adjust the convergence position of the charged particle beam on the surface of the sample 104. Further, since the information relating to the outer shape of the sample is displayed on the monitor 109 together with the image captured by the camera 107, it is possible for the user to grasp the relation between the outer shape of the sample 104 and the convergence position of the charged particle beam. That is, it becomes easy to observe the sample under an optical condition in which the charged particle beam converges on the surface of the sample 104.

FIG. 5A is an example of a screen displayed on the monitor 109 as a user interface during the execution of the evacuation operation. As an example, this screen can include a message 501 indicating that the evacuation operation is in progress (for example, "evacuating") and a progress bar 502 indicating a progress status of the evacuation operation. When the evacuation operation is completed, the screen of FIG. 5A is closed. Further, when it is desired to stop the evacuation operation itself, "cancel" on the lower right of the screen is clicked.

Further, during the execution of an adjustment sequence, the monitor 109 displays a message screen of FIG. 5A as well as the first image 201 for confirming the state of the inside of the sample chamber 102 as shown in FIG. 5B. In the first image 201, the outer shape or outline of the sample 104 obtained in step 404 is surrounded by a frame line 503 and highlighted. The frame line 503 corresponds to outer shape data of the sample 104 and the sample table 105 extracted in the third image 203 (FIG. 2). Furthermore, according to the optical condition set in step 408, the position of the convergence point of the charged particle beam is displayed with a marker 504. According to the adjustment sequence executed by the control unit 112, automatic control is performed so that the frame line 503 and the marker 504 match each other (steps 404 to 406 in FIG. 4), but a progress of this adjustment sequence may also be observed on the monitor 109. By displaying such a screen (FIG. 5B) as the user interface on the monitor 109, the user can visually grasp the positional relation between the sample 104, the electron optics system 101, and the detector 103. When the adjustment sequence for controlling the position of the movable stage 106 is completed, the frame line 503 and the marker 504 are displayed on the display screen of the monitor 109 in a superimposed manner.

In the procedure of the adjustment sequence described in FIG. 4, an example in which the adjustment sequence is executed from the start to the completion of the evacuation operation of the sample chamber 102 is described. However, the adjustment sequence is not necessarily completed during the execution of the evacuation operation, and the adjustment sequence may be executed before the start of the evacuation operation. Conversely, the adjustment sequence may be started after the evacuation operation is completed. Further, the adjustment sequence and the evacuation operation may partially overlap each other in time.

Also in a charged particle beam device equipped with a plurality of light sources such as FIB-SEM, by regarding an intersection of a plurality of optical axes as the convergence point and automatically controlling the frame line and the marker so as to overlap with each other, the plurality of light sources can be applied to the sample at the same time.

Embodiment 2

Next, the charged particle beam device 100 according to Embodiment 2 will be described with reference to FIGS. 6A to 6C. Since a basic configuration of the charged particle beam device 100 (FIGS. 1 to 3) of Embodiment 2 is substantially the same as that of Embodiment 1, duplicate description will be omitted below. Further, a basic procedure of executing the adjustment sequence is also substantially the same as that of Embodiment 1 (FIG. 4). Embodiment 2 is different from Embodiment 1 in term of the operation when the detection area of the sample 104 changes during an observation operation of the sample 104 and the height of the detection region to be observed (position in the Z direction) changes accordingly. Hereinafter, the difference will be described.

FIG. 6A to FIG. 6C are examples of screen displays (user interface) of the monitor 109 when the height (Z coordinate) of the detection region of the sample 104 changes. As shown in FIG. 6A, a case is considered in which two samples, for example, a first sample 601 and a second sample 602 are placed on the sample table 105. A height position of a surface of the second sample 602 is higher than that of the first sample 601. Here, as an example, as shown in FIG. 6A, the first sample 601 is placed on an optical axis O2 of the electron optics system 101, and the second sample 602 is placed at a position deviated from the optical axis O2. The first sample 601 and the second sample 602 may be physically separated samples, and the first sample 601 and the second sample 602 may also be physically connected and integrated.

In this case, as in Embodiment 1, on the monitor 109, the detection regions of the first sample 601 and the second sample 602 are highlighted with the frame line 503, and the convergence point of the charged particle beam is displayed with the marker 504. When the first sample 601 is located on the optical axis O2, matching between the detection region of the first sample 601 and the convergence point of the charged particle beam is detected.

By moving the movable stage 106 from this state, the sample located on the optical axis O2 is switched from the first sample 601 to the second sample 602. When the marker 504 is separated from the frame line 503 and approaches the second sample 602 side due to movement of the movable stage 106, a screen 605 as shown in FIG. 6B is displayed, and the user is notified that a detection target changes from the first sample 601 to the second sample 602, and the height (position in the Z direction) of the detection target changes (for example, "The height of the sample has changed."). If the user confirms this screen 605 and wants to continue observing the second sample 602 as it is, the user selects "close" of a selection button 607, thereby closing the screen 605. When observation of the second sample 602 is selected, the adjustment sequence for the second sample 602 to be detected is continued according to the procedure in FIG. 4.

On the other hand, if the user wants to restart the observation of the first sample 601, the user selects "reset" of the selection button 607. If the screen 605 is not desired to be displayed thereafter, by clicking a box of a display 606 (automatically switch the height of the "sample"), the screen as shown in FIG. 6B can be prevented from being displayed thereafter.

In the screen of FIG. 6B, when the observation of the second sample 602 is selected, alignment with respect to the second sample 602 to be detected is continued, and as a result, a state where the second sample 602 is moved on the optical axis O2 is obtained, as shown in FIG. 6C. As described above, according to Embodiment 2, even when there are two types of samples having different positions in the height direction and the observation target changes, the same operation as in Embodiment 1 can be performed on the changed sample.

Embodiment 3

Next, the charged particle beam device 100 according to Embodiment 3 will be described with reference to FIGS. 7A to 7C. Since the basic configuration of the charged particle beam device 100 (FIGS. 1 to 3) of Embodiment 3 is substantially the same as that of Embodiment 1, the duplicate description will be omitted below. Further, the basic procedure of executing the adjustment sequence is also substantially the same as that of Embodiment 1 (FIG. 4). Embodiment 3 relates to a charged particle beam device in which the movable stage 106 is capable of performing an inclination operation (tilt) and the inclination angle T thereof can be changed. Further, Embodiment 3 is different from the above-described embodiments in that the adjustment sequence of the movable stage 106 can be executed even when the inclination operation is performed. The display on the monitor 109 is also different from the above-described embodiments.

FIG. 7A to FIG. 7C are examples of the screen displays (user interface) of the monitor 109 when the inclination operation is performed on the movable stage 106. Here, as shown in FIG. 7A, the movable stage 106 rotationally moves on an arc having a radius D with an inclined rotation axis 701 whose longitudinal direction is a direction perpendicular to the sheet of FIG. 7A (Y-axis direction) as a center of rotation, so that the surface of the movable stage 106 can be inclined. When the inclination angle T is adjusted in this way, the sample 104 can be observed from an oblique direction, whereas the detection target located on the optical axis O2 before rotation moves to a position deviated from the optical axis O2. Therefore, the charged particle beam device 100 of Embodiment 3 executes control for correcting a deviation caused by adjustment of the inclination angle T.

The control for correcting the deviation will be described with reference to FIG. 7B. According to an operation of the user or an instruction of a control program, when the movable stage 106 rotates about the inclined rotation axis 701 by the inclination angle T (rotation radius D), a detection point Pw located on the optical axis O2 before the start of rotation moves to a detection point Pw' away from the optical axis O2 after the rotation is completed. In this case, a distance H between the detection point Pw before rotation and the detection point Pw' after rotation is $H=2D \times \sin(T/2)$.

Meanwhile, a deviation amount Dz in the Z direction between the detection points Pw and Pw' is $Dz=H \times \sin(90-T/2)$. Furthermore, a deviation amount Dx in the X direction between the detection points Pw and Pw' is $Dx=H \times \cos(90-T/2)$. When a magnitude of the inclination angle T is determined in this way, the deviation amounts Dx and Dz can also be calculated. The control unit 112 moves the movable stage in the Z direction and the X direction based on the calculated Dx and Dz so that the portion observed before the start of rotation can be continuously observed. In other words, even when the movable stage 106 is adjusted to be inclined, it is possible to automatically prevent the change in the observation position.

In Embodiment 3, the inclination angle of the movable stage 106 can be adjusted, and by calculating the deviation amounts Dx and Dz caused by the inclination adjustment thereof and instructing the movable stage 106 to move in the X and Y directions by the control unit 112, the deviation can be corrected. The same adjustment sequence as in the above-described embodiment (FIG. 4) can be executed while such deviation amounts Dx and Dz are adjusted.

FIG. 7C is an example of the first image 201 regarding the state of the inside of the sample chamber 102 imaged by the camera 107 when the inclination adjustment is performed in this way. Since such a first image 201 is displayed, the user can perform the inclination adjustment and can visually grasp the positional relation between the sample 104, the electron optics system 101, and the detector 103 by referring to the first image 201.

Embodiment 4

Next, the charged particle beam device 100 according to Embodiment 4 will be described with reference to FIG. 8. Since the basic configuration of the charged particle beam device 100 (FIGS. 1 to 3) of Embodiment 4 is substantially the same as that of Embodiment 1, the duplicate description will be omitted below. Further, the basic procedure of executing the adjustment sequence is also substantially the same as that of Embodiment 1 (FIG. 4). In Embodiment 4, the movable stage 106 rotates about the Z axis (vertical direction of the movable stage 106), and the rotation angle R thereof can be adjusted.

The operation in Embodiment 4 will be described with reference to FIG. 8. For example, as shown on the left side of FIG. 8, the sample 104 has a height difference on the surface thereof and includes a first region 801 having a higher position in the Z direction and a second region 802 having a lower position in the Z direction than the first region 801. When the second region 802 of the sample 104 is to be observed, the first region 801 exists between the second region 802 as the detection target and the detector 103 and may shield secondary electrons and the like (see FIG. 8A).

By confirming the first image 201 on the monitor 109, the user can confirm that the second region 802 to be detected is shielded by the first region 801. After confirming the first image 201, the user inputs an instruction to rotate the movable stage 106 from an input unit (not shown), thereby rotating the movable stage 106 by the rotation angle R (for example, 180 degrees) to obtain a state of FIG. 8B. By the rotation of the movable stage 106, the first region 801 is retracted from the position sandwiched between the second region 802 and the detector 103, thereby enabling observation of the second region 802. By such a rotational operation of the movable stage 106, the second region 802 can be made observable, and then the adjustment sequence similar to that of the above-described embodiments can be executed.

Embodiment 5

Next, the charged particle beam device 100 according to Embodiment 5 will be described with reference to FIG. 9.

Since the basic configuration of the charged particle beam device 100 (FIGS. 1 to 3) of Embodiment 5 is substantially the same as that of Embodiment 1, the duplicate description will be omitted below. Further, the basic procedure of executing the adjustment sequence is also substantially the same as that of Embodiment 1 (FIG. 4). Embodiment 5 is different from the above-described embodiments in that as shown in FIG. 9, Embodiment 5 controls the movable stage 106 by using movable range definition data 901 that defines a movable range of the movable stage 106. The movable range definition data 901, for example, may be stored in the database 111 in advance, and may be obtained from the first image 201 or the second image 202 by a sequential calculation. The movable range definition data 901 may also change depending on the position of the detector 103.

The movable range definition data 901 specifies a range in which the movable stage 106 can move, and when the electron optics system 101 and the detector 103 enter or intend to enter the range defined by the movable range definition data 901 by the movement of the movable stage 106, the movement of the movable stage 106 is restricted or prohibited by the control unit 112. Thereby, it is possible to prevent the sample 104 or the sample table 105 from colliding with the electron optics system 101 or the detector 103.

Further, an image 902 obtained by displaying the image showing the movable range definition data 901 in a manner superimposing the image captured by the camera 107 can be displayed on the monitor 109. By displaying the movable range definition data 901 on the monitor 109, the user can confirm whether or not the sample 104 and the sample 105 are at a safe distance from the electron optics system 101 or the detector 103.

Embodiment 6

Next, the charged particle beam device 100 according to Embodiment 6 will be described with reference to FIG. 10A and FIG. 10B. Since the basic configuration of the charged particle beam device 100 (FIGS. 1 to 3) of Embodiment 6 is substantially the same as that of Embodiment 1, the duplicate description will be omitted below. Further, the basic procedure of executing the adjustment sequence is also substantially the same as that of Embodiment 1 (FIG. 4). In the charged particle beam device of Embodiment 6, in addition to the optical camera 107, another optical camera (not shown) captures the sample table 105 and the sample 104 from above, that is, from a direction substantially parallel to the optical axis of the electron optical system 101.

In the above-described embodiment, the movable stage 106 is moved to the convergence point of the charged particle beam when the evacuation operation is completed, so that the sample 104 on the optical axis of the electron optics system 101 is in an observable state. In Embodiment 6, an image of the sample chamber 102 is captured by the optical camera 107 from a direction substantially horizontal to the surface of the movable stage 106, and an image of the sample table 105 is captured by the additional optical camera from substantially directly above the sample table (from a direction substantially perpendicular to the surface of the movable stage 106). Imaging with the additional optical camera may be performed before step 402 or between steps 403 to 407 in FIG. 4.

FIG. 10A shows an example of an image 1001 captured from directly above the sample table 105 by the additional optical camera. In this image 1001, an outer diameter Rtb of the sample table 105 and shape data Dtb of a boundary of the sample table 105 are set. The outer diameter Rtb and the shape data Dtb are associated with coordinate data of the movable stage 106 in the control unit 112.

In Embodiment 6, as shown in FIG. 10B, in addition to the same screen as in Embodiment 1, the image 1001 of FIG. 10A is displayed. Thereby, while confirming the image 1001 during the evacuation operation, it is possible to execute the alignment in the X and Y directions in addition to the alignment in the Z direction. As an example, by the end of step 407 in FIG. 4, a field of view to be observed on the image 1001 is designated by an input means (mouse or the like) (not shown). The designated field of view is displayed by an observation position indicator 1006. When the observation position indicator 1006 is set and updated, the control unit 112 controls the movable stage 106 to a center of the observation position indicator 1006 according to a result of an association of coordinates in the control unit 112.

Furthermore, the control unit 112 controls a magnification of the electron optics system 101 so as to match a width of the observation position indicator 1006. Thereby, the position to be observed (X axis, Y axis, and Z axis) during the evacuation operation can be determined. In step 408, the observation image by the charged particle beam is displayed on the monitor 109 in the same field of view as an optical image in the observation position indicator 1006, and the observation can be started immediately after the evacuation is completed.

While certain embodiments of the invention have been described, these embodiments have been presented by way of example only and are not intended to limit the scope of the invention. The novel embodiments may be implemented in a variety of other forms, and various omissions, substitutions, and changes may be made without departing from the spirit of the invention. These embodiments and modifications thereof are included in the scope and spirit of the invention and are also included in the invention described in the claims and an equivalent scope thereof.

Further, a part or all of the above-described configurations, functions, processing units, processing means, and the like may be realized by hardware, for example, by designing with an integrated circuit. Further, the above-mentioned configurations, functions, and the like may be implemented by software by means of a processor interpreting and executing a program for realizing respective functions. Information such as a program, a table, a file, and the like for realizing each function can be stored in various types of non-transitory computer readable medium. As a non-transitory computer-readable medium, for example, a flexible disk, a CD-ROM, a DVD-ROM, a hard disk, an optical disk, a magneto-optical disk, a CD-R, a magnetic tape, a non-volatile memory card, a ROM, or the like is used. Further, in the above-mentioned embodiments, control lines and information lines are considered to be necessary for description, and all control lines and information lines are not necessarily shown in the product. All of the configurations may be connected to each other.

REFERENCE SIGN LIST

101 electron optics system
102 sample chamber
103 detector
104 sample
105 sample table
106 movable stage
107 camera
108 imaging field of view
109 monitor
110 processor
111 database
112 control unit

The invention claimed is:

1. A charged particle beam device comprising:
an electron optics system configured to irradiate a sample table with a charged particle beam;
a movable stage on which the sample table is to be placed;
a sample chamber that accommodates the movable stage;
a detector configured to detect a signal from a sample placed on the sample table;
a camera configured to capture an image of the sample table and the sample;
an extraction means configured to extract outer shape information relating to outer shapes of the sample table and the sample from the image captured by the camera;
a processor programmed to control the movable stage based on the outer shape information; and
a display unit configured to display an image relating to the outer shape information together with the image captured by the camera.

2. The charged particle beam device according to claim 1, wherein
the display unit is configured to display an image relating to a position of a convergence point of the charged particle beam in a superimposed manner together with the image relating to the outer shape information and the image captured by the camera.

3. The charged particle beam device according to claim 2, wherein
the processor is programmed to control the movable stage based on the image relating to the position of the convergence point and the image relating to the outer shape information.

4. The charged particle beam device according to claim 1, wherein
the processor is programmed to highlight the image relating to the outer shape information in the image captured by the camera.

5. The charged particle beam device according to claim 1, wherein
the sample table is attachable to and detachable from the movable stage.

6. The charged particle beam device according to claim 1, further comprising:
a database that stores an image of an inside of the sample chamber, wherein
the extraction means is configured to extract the outer shape information by comparing the image captured by the camera with the image in the database.

7. The charged particle beam device according to claim 6, wherein
the database stores an image of the sample chamber in a state where the sample and the sample table are not inserted into the sample chamber.

8. The charged particle beam device according to claim 6, wherein
the database stores a plurality of images of the inside of the sample chamber, and
the plurality of images of the inside of the sample chamber are different from each other in a position of the movable stage.

9. The charged particle beam device according to claim 6, wherein
the database stores a plurality of images of the inside of the sample chamber, and the plurality of images of the inside of the sample chamber are different from each other in whether the detector is inserted into the sample chamber.

10. The charged particle beam device according to claim 1, wherein
the display unit is configured to display information indicating a case in which a height of a detection region of the sample changes.

11. The charged particle beam device according to claim 1, wherein
the movable stage has an inclination angle that can be adjusted, and
the processor is programmed to execute control for correcting a deviation of a detection position caused by adjustment of the inclination angle.

12. The charged particle beam device according to claim 1, wherein
the movable stage is configured to rotate around a vertical direction thereof.

13. The charged particle beam device according to claim 1, wherein
the processor is programmed to control the movable stage based on movable range definition data that defines a movable range of the movable stage.

14. The charged particle beam device according to claim 1, wherein
the camera is configured to capture an image of the sample chamber from a direction substantially horizontal to a surface of the movable stage and from a direction substantially perpendicular to the surface of the movable stage.

* * * * *